United States Patent
Gutsche et al.

(10) Patent No.: US 7,119,395 B2
(45) Date of Patent: Oct. 10, 2006

(54) MEMORY CELL WITH NANOCRYSTALS OR NANODOTS

(75) Inventors: Martin Gutsche, Dorfen (DE); Josef Willer, Riemerling (DE); Cay-Uwe Pinnow, München (DE); Ralf Symanczyk, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/916,013

(22) Filed: Aug. 11, 2004

(65) Prior Publication Data

US 2005/0067659 A1 Mar. 31, 2005

(30) Foreign Application Priority Data

Aug. 11, 2003 (DE) ............................. 103 36 876

(51) Int. Cl.
*H01L 29/788* (2006.01)

(52) U.S. Cl. .................. 257/321; 257/319; 257/369; 257/405

(58) Field of Classification Search ............. 257/319, 257/324, 369, 405, 406, 410, 411, 321, 296
See application file for complete search history.

(56) References Cited

U.S. PATENT DOCUMENTS

| | | | |
|---|---|---|---|
| 5,091,763 A * | 2/1992 | Sanchez | ..................... 257/344 |
| 5,714,766 A | 2/1998 | Chen et al. | |
| 5,877,523 A | 3/1999 | Liang et al. | |
| 6,054,349 A | 4/2000 | Nakajima et al. | |
| 6,335,554 B1 | 1/2002 | Yoshikawa | |
| 6,855,979 B1 * | 2/2005 | Sadd et al. | .................. 257/319 |
| 6,878,582 B1 * | 4/2005 | Dokumaci et al. | .......... 438/217 |
| 2003/0042534 A1 | 3/2003 | Bharracharyya | |
| 2003/0230629 A1 * | 12/2003 | Bourianoff et al. | ......... 235/454 |
| 2004/0124415 A1 * | 7/2004 | Walker et al. | ................ 257/65 |
| 2004/0145023 A1 * | 7/2004 | King et al. | ................. 257/369 |

FOREIGN PATENT DOCUMENTS

| | | |
|---|---|---|
| DE | 100 36 911 C2 | 2/2002 |
| DE | 101 44 700 A1 | 4/2002 |
| DE | 101 40 758 A1 | 4/2003 |
| EP | 1 304 730 A2 | 4/2003 |

OTHER PUBLICATIONS

Müller, T., et al., "Size and Location Control of Si Nanocrystals at Ion Beam Synthesis in Thin $SiO_2$ Films," Annual Report IIM 2002, FZR-362, pp. 29-32.

Boaz, E, et al., "Can NROM, a 2-bit, Trapping Storage NVM Cell, Give a Real Challenge to Floating Gate Cells?", 1999 Saifun Semiconductors Ltd., Presented at the International Conference on Solid State Devices and Materials, Tokyo, 1999, pp. 1/3-3/3.

Von Borany, J., et al., "Memory properties of $Si_+$implanted gate oxides: from MOS capacitors to nvSRAM," Solid State Electronics 46 (2002) 1729-1737.

(Continued)

*Primary Examiner*—Nathan J. Flynn
*Assistant Examiner*—Tan Tran
(74) *Attorney, Agent, or Firm*—Slater & Matsil, L.L.P.

(57) ABSTRACT

The storage layer (6) is in each case present above a region in which the channel region (3) adjoins a source/drain region (2) and is in each case interrupted above an intervening middle part of the channel region (3). The storage layer (6) is formed by material of the gate dielectric (4) and contains silicon or germanium nanocrystals or nanodots introduced through ion implantation. The gate electrode (5) is widened at the flanks by electrically conductive spacers (7).

7 Claims, 6 Drawing Sheets

OTHER PUBLICATIONS

Normand, P., et al., "Effect of annealing environment on the memory properties of thin oxides with embedded Si nanocrystals obtained by low-energy ion-beam synthesis," Applied Physics Letters, vol. 83, No. 1, pp. 168-170, Jul. 7, 2003.

Garrido, B., et al., "The effect of additional oxidation on the memory characteristics of metal-oxide-semiconductor capacitors with Si nanocrystals," Applied Physics Letters, vol. 82, No. 26, pp. 4181-4820, Jun. 30, 2003.

* cited by examiner

MEMORY CELL WITH NANOCRYSTALS OR NANODOTS

This application claims priority to German Patent Application 103 36 876.0, which was filed Aug. 11, 2003 and is incorporated herein by reference.

TECHNICAL FIELD

The present invention relates generally to a memory cell, and more particularly to a memory cell with nanocrystals or nanodots.

BACKGROUND

U.S. Pat. No. 5,877,523 has described a semiconductor memory cell, which is suitable for storing a plurality of bits. In this cell, two separate floating gate electrodes are located at the ends of a channel region above two adjoining LDD regions of source and drain. A control gate electrode is present for driving purposes. Charges can be stored separately in the two floating gate electrodes, in order in this way to alter the relevant programming state of the cell. In a middle part of the channel region there is only the control gate electrode above a dielectric layer on the semiconductor material.

German Patent No. 100 36 911 C2 has disclosed a method for fabricating a multi bit memory cell which has separate parts of a storage layer which are intended for charge trapping and are in each case present at the boundaries between source or drain and the channel region. In this method, a source region and a drain region are formed by the introduction of dopant in a semiconductor body, and a storage layer which is intended to store charge carriers is arranged between boundary layers above these regions; the storage layer may in particular be a nitride, and the boundary layers may in each case be oxide, and the storage layer may be removed with the exception of regions that are located at the boundary between the channel region and the source region and at the boundary between the channel region and the drain region. Therefore, the storage layer is interrupted above a middle part of the channel region. This structure is fabricated by the production of an auxiliary layer which, in the region of the storage layer, has a cut-out, with spacers produced at the flanks of the auxiliary layer. Then, the middle parts of the storage layer are removed between these spacers. Only then is the gate electrode fabricated and patterned.

U.S. Pat. No. 5,714,766 has described a memory component having a transistor structure with source/drain regions, a channel arranged between them and a storage layer structure between the channel and a gate electrode, wherein the storage layer structure comprises upper and lower barrier layers and nanocrystals arranged between them. The document mentions silicon, germanium, silicon-germanium, silicon carbide, gallium arsenide, indium arsenide and other IV, III–V and II–VI semiconductor materials, as well as compound semiconductors formed therefrom, as material for the nanocrystals.

The publication by J. von Borany et al.: "Memory properties of Si+ implanted gate oxides: from MOS capacitors to nvSRAM" in Solid-State Electronics 46, 1729–1737 (2002) describes the properties of memory components in which silicon regions described as nanoclusters have been produced by implantation of Si+ into the gate oxide. The gate electrode is applied direct to a layer of this type.

U.S. Pat. No. 6,335,554 B1 describes a memory cell having a charge trapping layer, which is present above the junctions between LDD regions and the channel region and at the flanks of the gate electrode. Two gate electrodes, which are in each case designed in the form of spacers are present above the charge trapping layer and are connected to the first gate electrode via a top-side conductive layer.

SUMMARY OF THE INVENTION

In one aspect, the present invention provides a multibit memory cell which uses a surface area of just 3 $F^2$ per bit with a ground rule of 90 nm and can be fabricated with STI insulations in a virtual ground array with sublithographic, locally delimited storage regions which are self-aligned with respect to the gate electrode.

In the memory cell, a storage layer, which contains nanocrystals or nanodots is in each case present above a region in which the channel region adjoins a source/drain region and is interrupted above an intervening middle part of the channel region. The storage layer is planar and is formed by a material of the gate dielectric. This is preferably a silicon dioxide layer in which silicon or germanium nanocrystals are produced by ion implantation. The storage layer preferably extends a small distance below the gate electrode, which is achieved by virtue of electrically conductive spacers, which are electrically conductively connected to the gate electrode, being arranged so as to lengthen the gate electrode at source-side and drain-side flanks of the actual gate electrode. The spacers are simultaneously intended to produce a self-aligned arrangement of the channel-side boundaries of these source/drain regions with respect to the gate electrode during the implantation of dopant for the purpose of forming the source/drain regions. These junctions are therefore located beneath the storage layer and beneath the electrically conductive spacers but adjacent to the actual gate electrode.

The actual gate electrode may be formed by a layer of a word line web which may in particular be a stack formed from one or more conductive layers and a hard-mask layer for patterning the word line web. A bottom layer, which forms the gate electrode, may, for example, be polysilicon. A further layer, for example of tungsten silicide, may be present above this in order to lower the bulk resistance of the word lines. The source-side and drain-side flanks of the gate electrode may be provided with an overhang, beneath which there is in each case arranged an electrically conductive spacer, so that the gate electrode or the word line web overall has vertical or at least planar flanks. The overhang may be formed by the bottom layer tapering toward the semiconductor body or by the bottom layer being narrower than a further layer, which is present above it and forms the overhang.

In the method for fabricating a memory cell of this type, a layer, which is intended for the gate dielectric is applied to the semiconductor material. The gate electrode is applied to this and patterned, with the gate electrodes of a memory cell array preferably being patterned to form word line webs. Then, nanocrystals or nanodots are produced laterally with respect to the gate electrode by ion implantation; suitable materials for these nanocrystals or nanodots include silicon and germanium as well as special silicon oxynitride (producible by implantation of nitrogen), indium, gallium, tin, arsenic and tungsten.

BRIEF DESCRIPTION OF THE DRAWINGS

There now follows a more detailed description of examples of the memory cells and of the method with reference to FIGS. 1 to 12.

DETAILED DESCRIPTION OF ILLUSTRATIVE EMBODIMENTS

Figure 1:
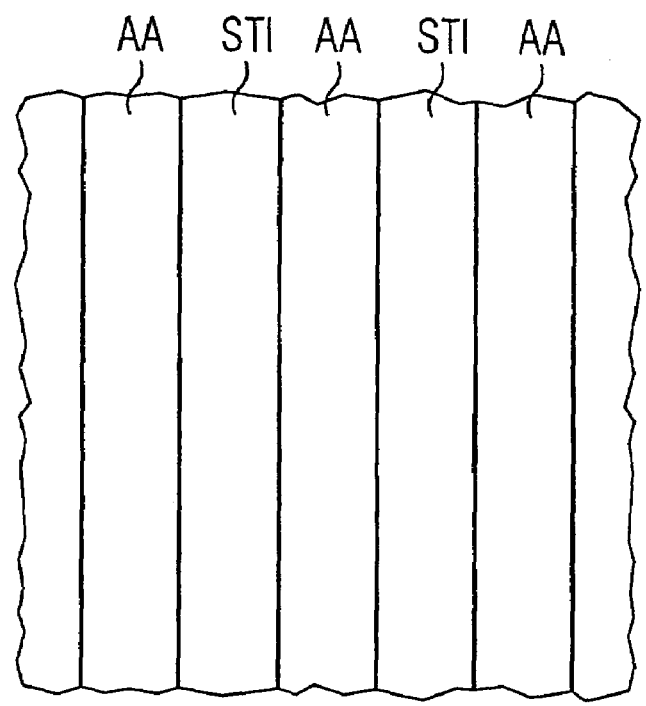
FIG. 1 shows a plan view of the arrangement of the active areas.

FIG. 1 shows a plan view of a semiconductor body in which active areas AA are isolated from one another by insulation regions STI (shallow trench isolations) in strip form arranged parallel to and at a distance from one another. The transistor structures of the memory cells are formed in the active areas AA. The strip-like word lines WL, which are likewise arranged parallel to and at a distance from one another, run transversely with respect to the strips of the active areas AA.

Figure 2:
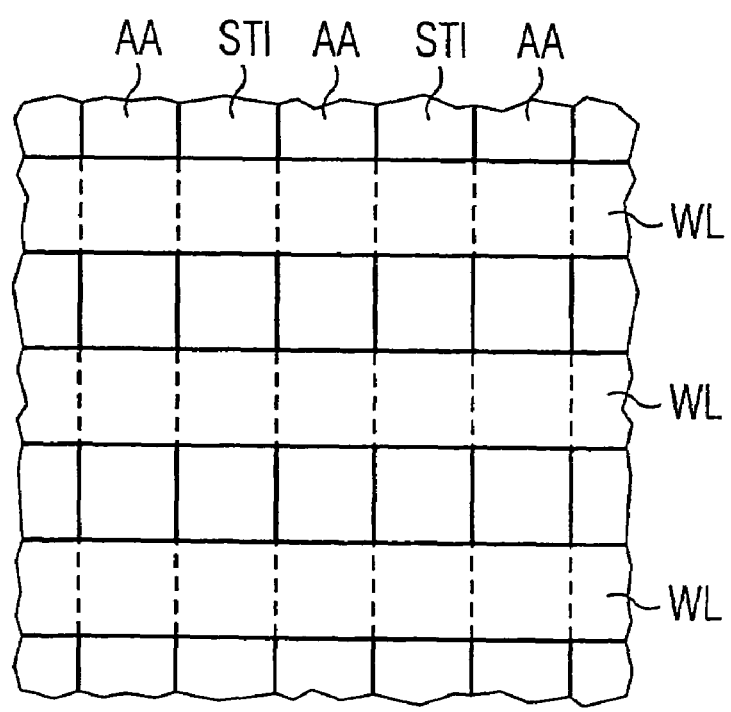
FIG. 2 shows the same diagram as FIG. 1 but with the addition of the arrangement of the word lines.

FIG. 2 shows the arrangement of the word lines WL relative to the active areas AA on the top side of the semiconductor body. The parts of the word lines WL which run over the active areas AA simultaneously form the gate electrodes of the memory cell transistors.

Figure 3:
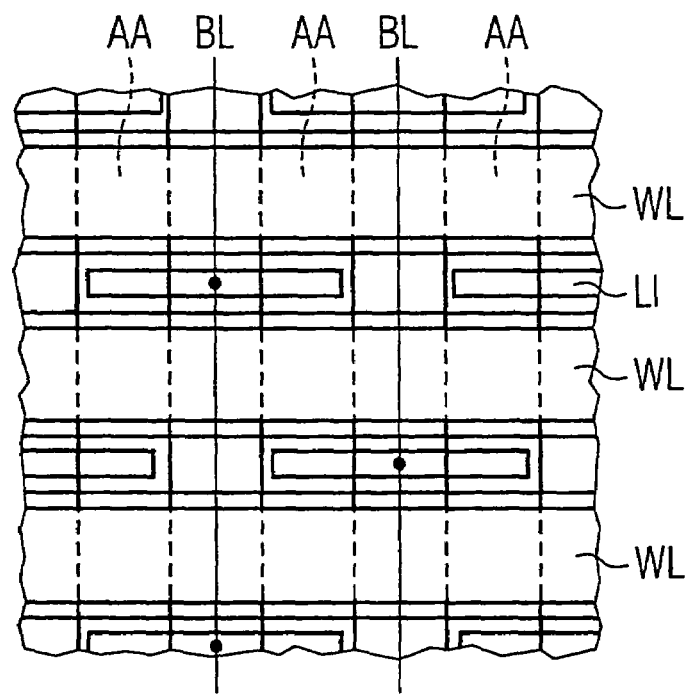
FIG. 3 shows the same diagram as FIG. 2 but with the addition of the arrangement of the transistor structures and bit line connections.

FIG. 3 shows the same diagram as FIG. 2, but with the inclusion of edge-side spacers along the flanks of the word lines WL. In the spaces between these spacers, electrically conductive local interconnects LI are in each case arranged between the word lines WL, and the bit lines BL, which run alongside the active areas AA above the insulation regions STI, are contact-connected at these local interconnects. The memory cells are in each case located in an active area AA, with the channel region being arranged beneath a respective word line and the source/drain regions being connected on the top side by local interconnects LI arranged on both sides of this word line WL. A memory cell is therefore driven in each case by means of a word line and two adjacent bit lines. The memory cell is suitable in particular for a memory cell array having the structure shown in FIG. 3.

There now follows a description of the preferred exemplary embodiments of the memory cell on the basis of examples of preferred fabrication methods. A semiconductor body or substrate is provided with a doped well intended for the transistors. The insulation regions STI illustrated in FIG. 1 are fabricated, as is customary, by etching out trenches which are arranged parallel to one another and are then filled with dielectric material. The active areas AA formed from semiconductor material remain in place between these trenches. Then, a layer of the material intended for the gate dielectric is produced over the entire surface. This may preferably be effected by producing a thermal gate oxide with a thickness of, for example, approximately 6 nm to 30 nm. Gate oxides for the transistors of a drive periphery (e.g. CMOS) may also be produced in this method step. The gate electrodes are fabricated on this layer, preferably as part of a respective word line web. The word line web is preferably formed as a stack, which comprises at least a first word line layer and a second word line layer, which are covered with a hard-mask layer.

Figure 4:
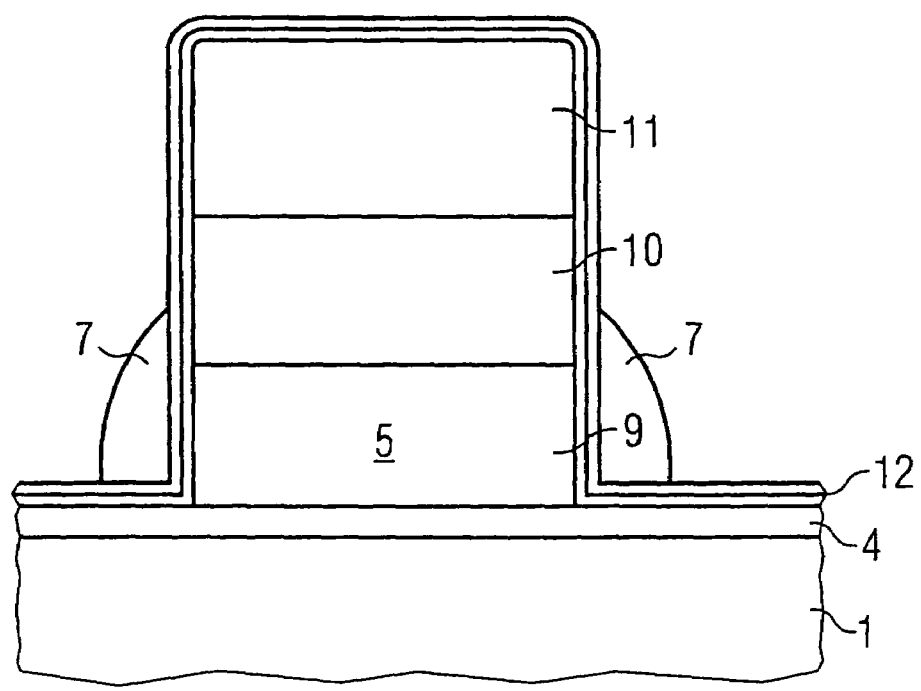
FIG. 4 shows a cross-section through an intermediate product of a memory cell arrangement following production of the electrically conductive spacers.

FIG. 4 shows a cross-section through the arrangement comprising the semiconductor body 1, the gate dielectric 4 and the patterned gate electrode 5 arranged thereon. The gate electrode 5 is preferably part of an electrically conductive first word line layer 9, which is patterned in the form of strips and may be formed, for example, from polysilicon. To reduce the electrical bulk resistance, it is possible to provide a second word line layer 10, which is, for example, tungsten silicide. In the example shown, the hard-mask layer 11, which is, for example, nitride, is located thereon. First of all, the hard mask is patterned in strip form by means of a resist mask and suitable lithography. The patterned hard-mask layer 11 is then used to pattern the entire word line web all the way down to the layer of the gate dielectric 4.

FIG. 4 also illustrates, in addition, a two-layer liner 12, which comprises, for example, a thin film of nitride and a thin film of oxide on top of it. This liner 12 facilitates the simultaneous fabrication of transistors of the drive circuit in the periphery of a memory cell array. At the transistors of the periphery, this liner 12 isolates the gate electrode 5 from electrically conductive spacers 7 that are applied subsequently. Since these electrically conductive spacers 7 are to be applied within the memory cell array in electrically conductive contact with the gate electrode 5 at each individual memory cell, the liner 12 is removed within the memory cell array. This removal may preferably be effected by wet-chemical means, initially partly using HF to remove the oxide, then using hot phosphoric acid in order to completely remove the nitride of the liner 12. In the region of the periphery, however, the liner 12 forms a separation between the gate electrodes and the electrically conductive spacer, which can therefore be removed selectively with respect to the material of the liner 12, for example in a dry-etching process by means of $SF_6$. In this case, the memory cell array is protected, for example, with the application of a resist.

After the optional liner 12 has been removed in the region of the memory cell array, a material for forming nanocrystals or nanodots in the layer of the gate dielectric 4 is introduced by ion implantation. This material is preferably silicon or germanium atoms. Nanodots can also be produced in a silicon dioxide layer through the introduction of nitrogen atoms, which form regions of SiON (silicon oxynitride). The nanodots may also comprise indium, gallium, tin, arsenic, and tungsten. Since the gate electrode 5 or the word line web in this case serves as a mask, the region below the gate electrode 5, possibly apart from the outer edge regions, remains free of the nanocrystals or nanodots. In the case of silicon atoms, the implantation energy is, for example, 6 keV, and the dose is, for example, $5 \times 10^{15}$ cm$^{-2}$. The implantation energy of typically 1 keV to 20 keV is suitably adapted to the thickness of the gate oxide previously produced. The position of the nanocrystals in the layer of the gate dielectric 4 approximately coincides with the location of the implantation maximum. Depending on the implantation parameters selected, the nanocrystals in the layer nay predominantly be concentrated in a middle part of the layer, so that approximately a three-layer structure is formed, in which a middle or storage layer part contains nanocrystals and is delimited at the top and bottom by layer parts in which scarcely any nanocrystals are detectable. Alternatively, it is also possible to produce an approximately homogenous distribution of the nanocrystals through the entire implanted layer (not shown) and also intermediate stages between the two extreme situations mentioned above.

After the surface has been cleaned, a layer intended for the spacers, preferably of polysilicon, is deposited conformally in a thickness of typically approximately 30 nm. This layer is etched back anisotropically, so that the spacers 7 illustrated in cross-section in the figure remain.

Figure 5:
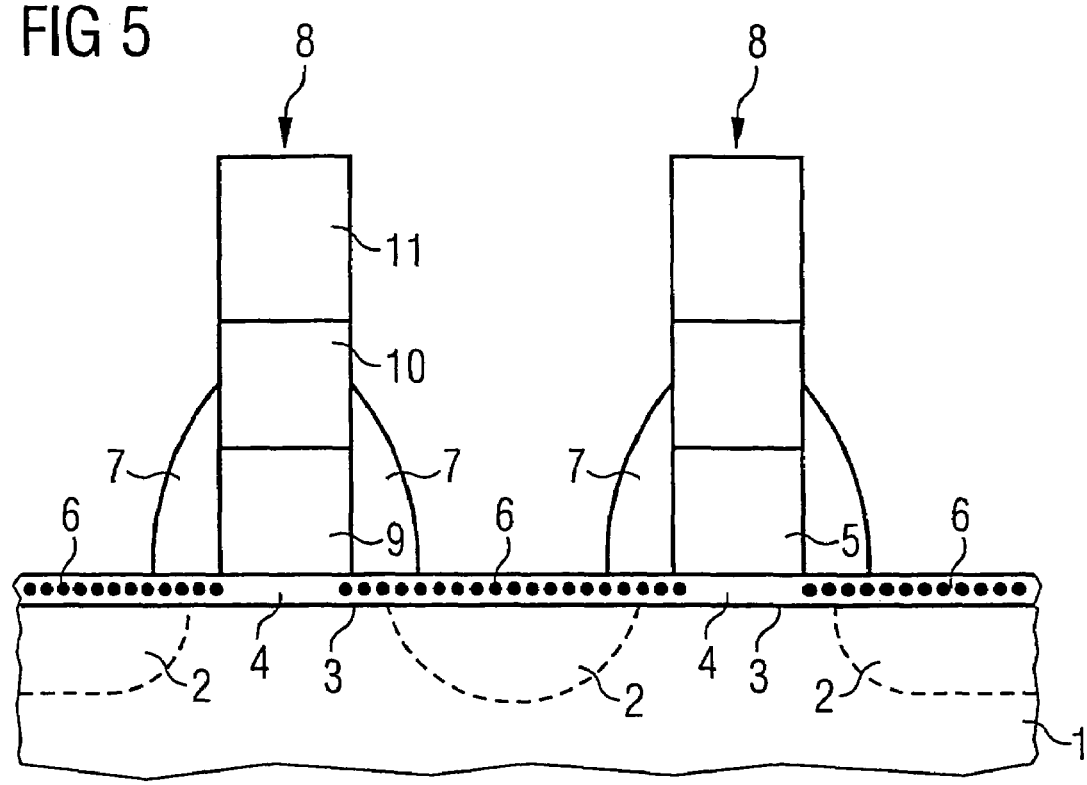
FIG. 5 shows a cross-section through an intermediate product of a memory cell arrangement following production of the source/drain regions.

FIG. 5 shows a cross-section through two memory cells arranged next to one another in a memory cell array and also reveals the possible extent of the storage layer 6. The storage layer 6 comprises the implanted regions of the layer of gate dielectric 4. The implanted nanocrystals or nanodots form the bonding locations for charge carriers and are indicated by dots in the storage layer 6 in FIGS. 5 to 12. The electrically conductive spacers 7 are now in electrical contact with the gate electrodes 5 at the flanks of the word line webs 8. The source/drain regions 2 are produced by an implantation of dopant, in the case of a p-doped well an n$^+$ implantation. The implants are annealed in the standard way in order to activate the dopant. As can be seen from FIG. 5, the source/drain regions 2 extend a certain distance under the electrically conductive spacers 7, so that the transition from the source/drain region 2 to the channel region 3 as indicated by the dashed lines is in each case beneath or covered by the nanocrystals or nanodots of the storage layer 6 and a respective electrically conductive spacer 7.

Figure 6:
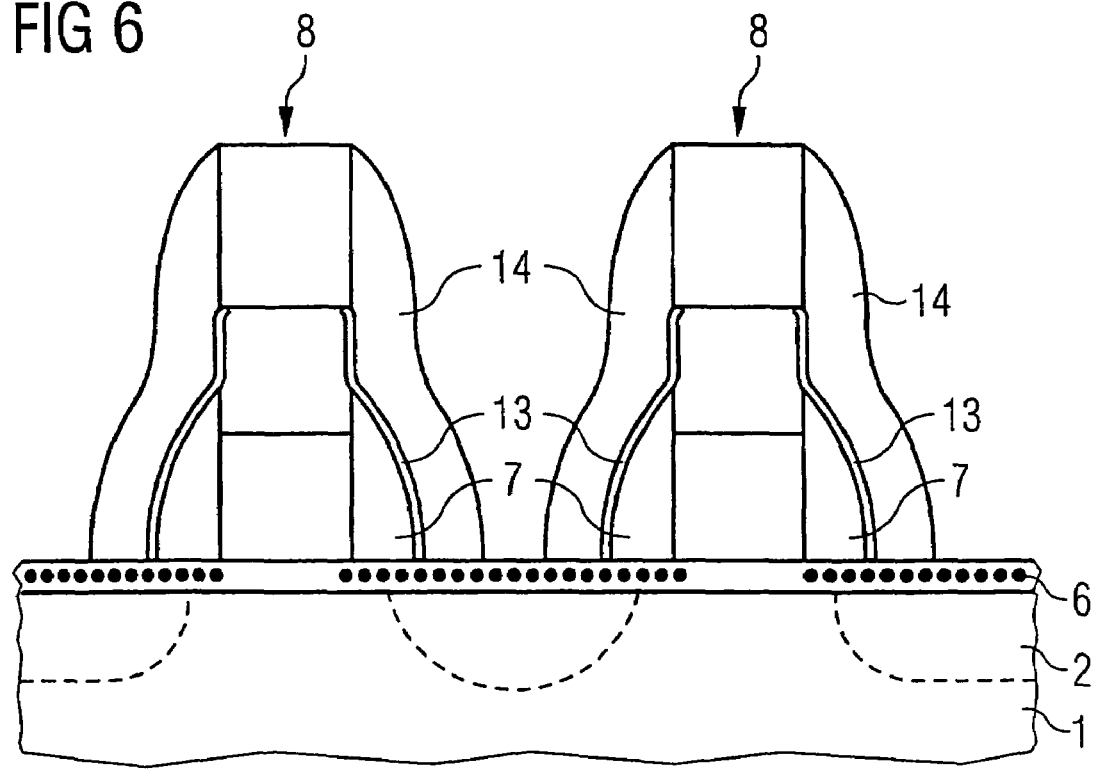
FIG. 6 shows the arrangement shown in FIG. 5 following production of dielectric insulating spacers.
Figure 7:
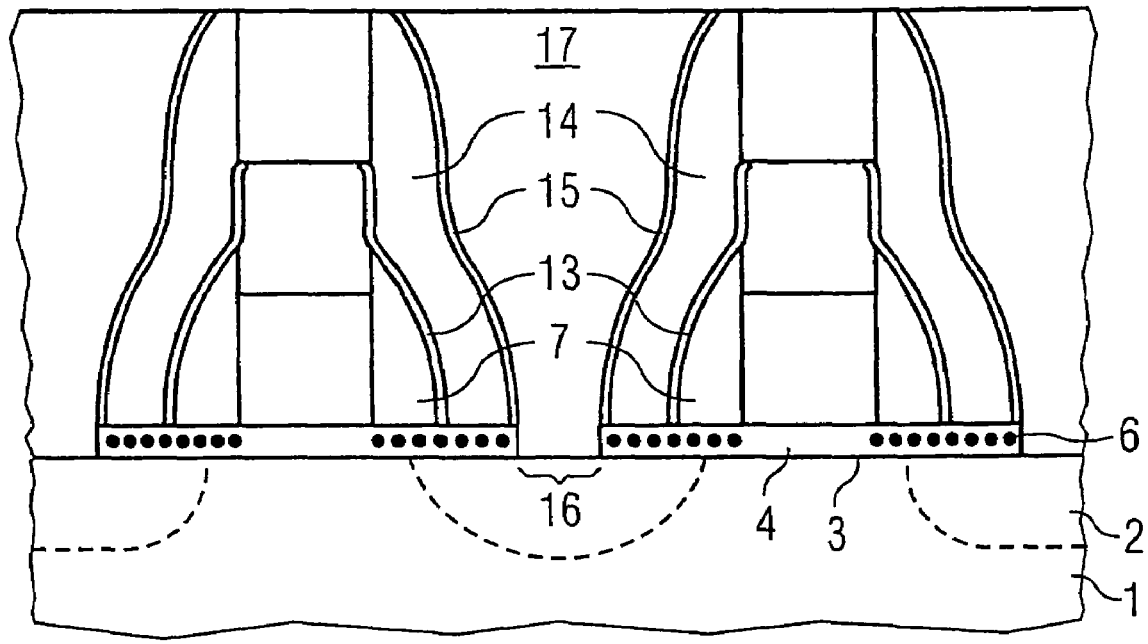
FIG. 7 shows a further intermediate product in cross-section following production of the source/drain contacts.

FIG. 7 shows the cross-section shown in FIG. 6 after further process steps, in which side wall oxidization is carried out in order to form a thin film of oxide 13 and a dielectric layer, e.g. a nitride, is applied to produce the dielectric spacers 14. For the transistors of the drive periphery, wider spacers, which can easily be removed in the region of the memory cell array using previously applied further liners 15, are required for the self-aligned implantation of the source/drain regions. The storage layer 6 is removed between the dielectric spacers 14, so that the contact region 16, in which the top sides of the source/drain regions are uncovered, are formed. The contact regions 16 may be electrically conductively contact-connected at the top by means of contact hole fillings 17. For this purpose, a conductive material, e.g. polysilicon, is introduced. The contact hole filling 17 also serves as a local interconnect LI in accordance with the illustration presented in FIG. 3. The patterning can be carried out by the contact hole filling 17 being etched back onto the regions of the local interconnects LI following the introduction and planarization of the electrically conductive material of the contact hole filling 17. Alternatively, it is possible for the region between the dielectric spacers 14 to be filled with a dielectric material, e.g. borophosphosilicate glass (BPSG), to produce contact holes therein and to fill these contact holes with the electrically conductive material of the contact hole filling 17. Conventional mask technology is used for this purpose. There then follow further steps for producing an intermetal dielectric and a bit line wiring plane together with contacts on the contact hole fillings 17, which are designed at a minimum pitch, as is known per se. This is followed by further method steps for completing the fabrication of a memory cell array.

Figure 8:
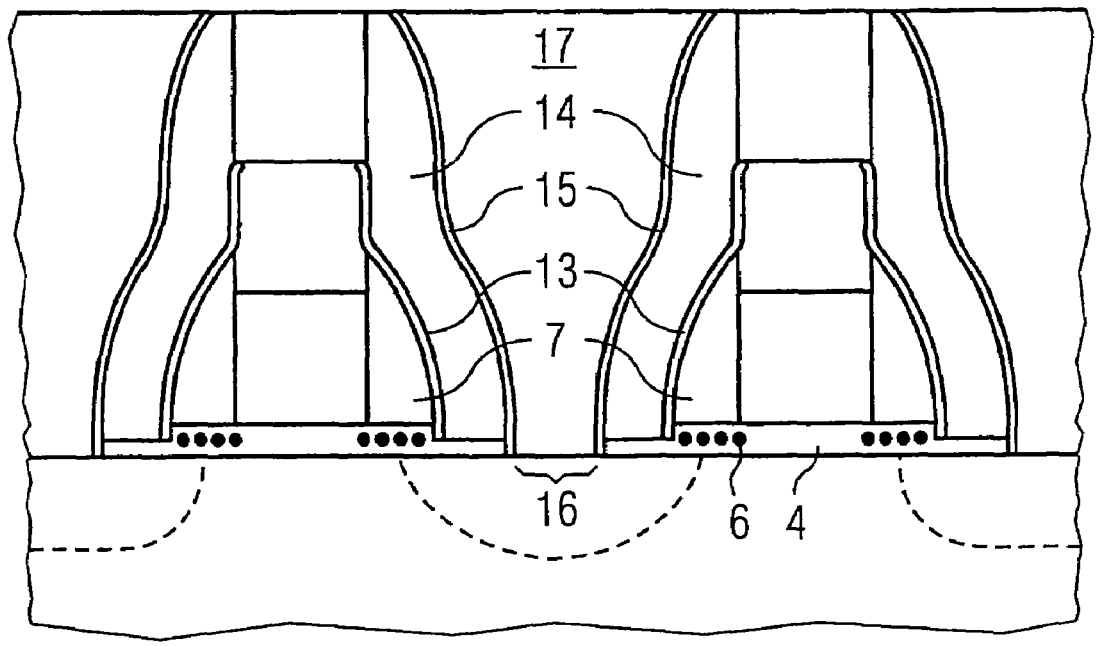
FIG. 8 shows an alternative configuration to the intermediate product as shown in cross-section in FIG. 7.

FIG. 8 shows the cross-section illustrated in FIG. 7 for an alternative exemplary embodiment; in which the storage layer 6 is removed to some extent following production of the electrically conductive spacers 7. In this way, the region of the nanocrystals or nanodots is in each case restricted to a narrower region above the boundaries between the source/drain regions and the channel region.

Figure 9:
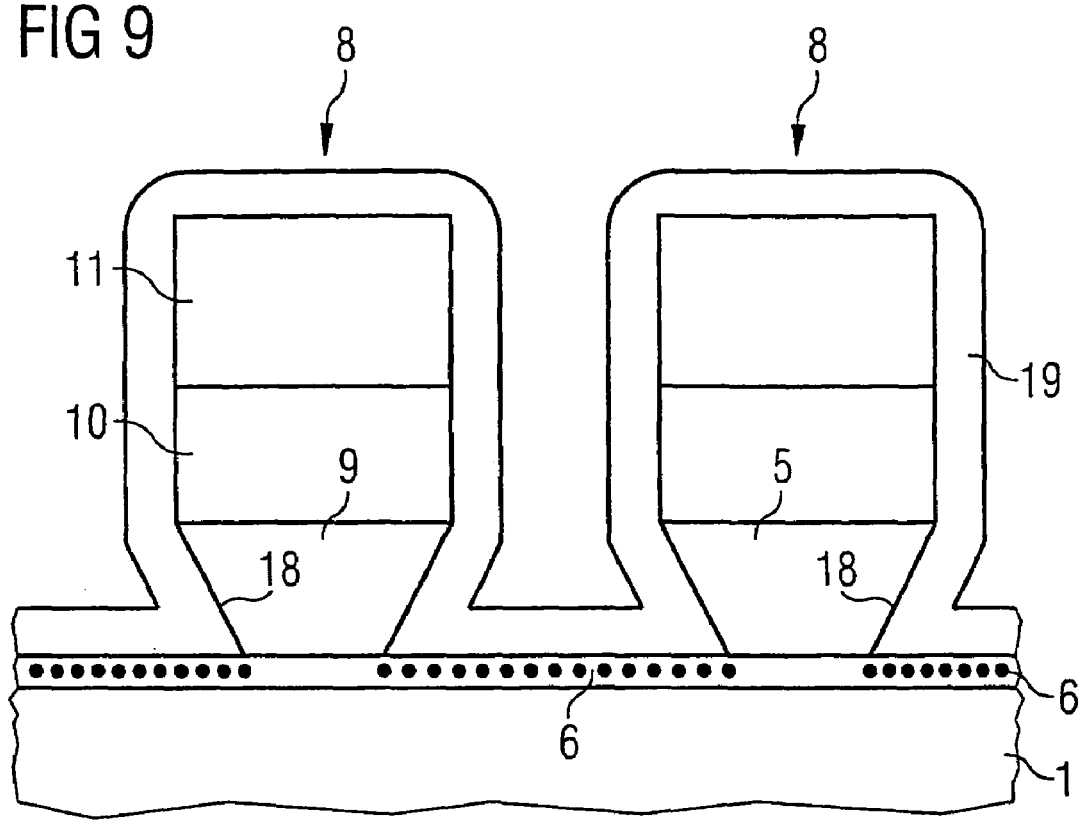
FIG. 9 shows a cross-section through an intermediate product of a further exemplary embodiment prior to the patterning of the electrically conductive spacers.

FIGS. 9 to 12 illustrate exemplary embodiments in which the electrically conductive spacers 7 are not produced on the outside at the edge of a vertical flank of the gate electrode, but rather are arranged beneath an overhang of the first word line layer or the subsequent layers, so that vertical or at least substantially planar flanks of the word line webs 8 including the electrically conductive spacers 7 are formed. FIG. 9 shows the arrangement in cross-section after application of a layer of electrically conductive material, preferably a polysilicon layer 19, which is intended for the electrically conductive spacers and is deposited isotropically in an edge-conformal manner. In this exemplary embodiment, the stack of the word line web 8 was previously modified by the first word line layer 9 being laterally etched back in such a way that this layer narrows toward the semiconductor body 1 and therefore appears to take the form of an overhanging trapezoid in cross-section. At the flanks of the word line webs 8 there are therefore, in each case, overhangs 18, beneath which the electrically conductive spacers are arranged. Since the first word line layer 9 in the lower region is narrower than the remainder of the word line web 8, the storage layer 6 is accordingly also formed partially beneath the edges of the word line web as a result of the ion implantation, so that in this exemplary embodiment too the electrically conductive spacers partially overlap the storage layer.

Figure 10:
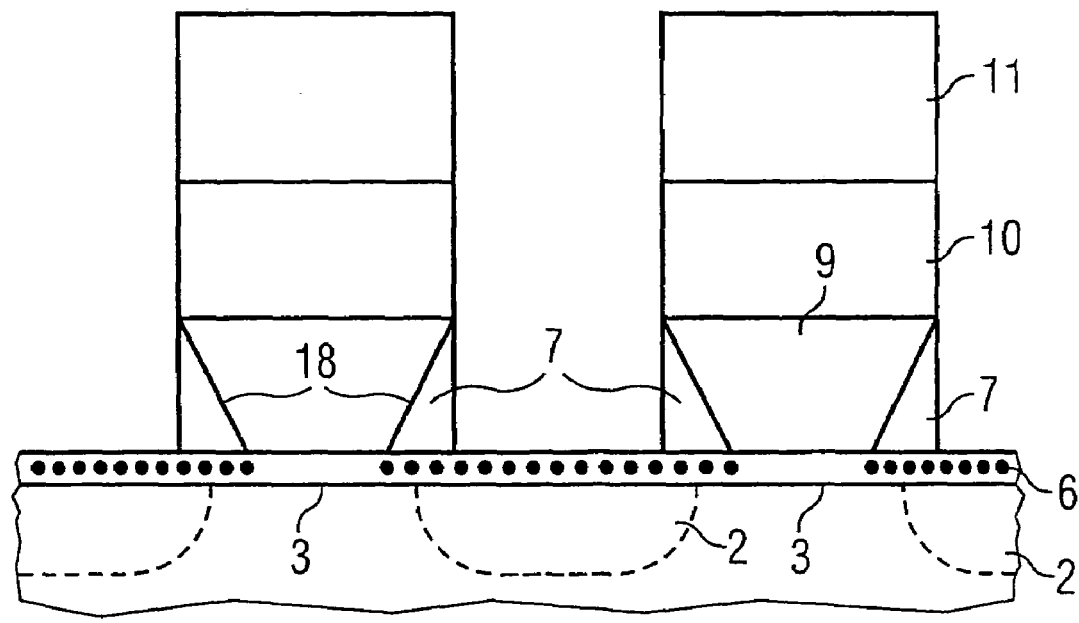
FIG. 10 shows the exemplary embodiment shown in FIG. 9 after the patterning of the electrically conductive spacers.

FIG. 10 shows the arrangement shown in FIG. 9 after the polysilicon layer 19 has been etched back anisotropically. All that remains of the polysilicon layer 19 is the electrically conductive spacers 7 that are present beneath the respective overhang 18. The electrically conductive spacers 7 cover the edge-side parts of the storage layer 6, which face the respective gate electrode. Then, the dopant for the source/drain regions 2 is introduced; in this exemplary embodiment too, it penetrates a certain distance under the electrically conductive spacers 7, so that the boundary between the source/drain regions 2 and the channel regions 3 is in each case arranged beneath the electrically conductive spacers 7.

Figure 11:
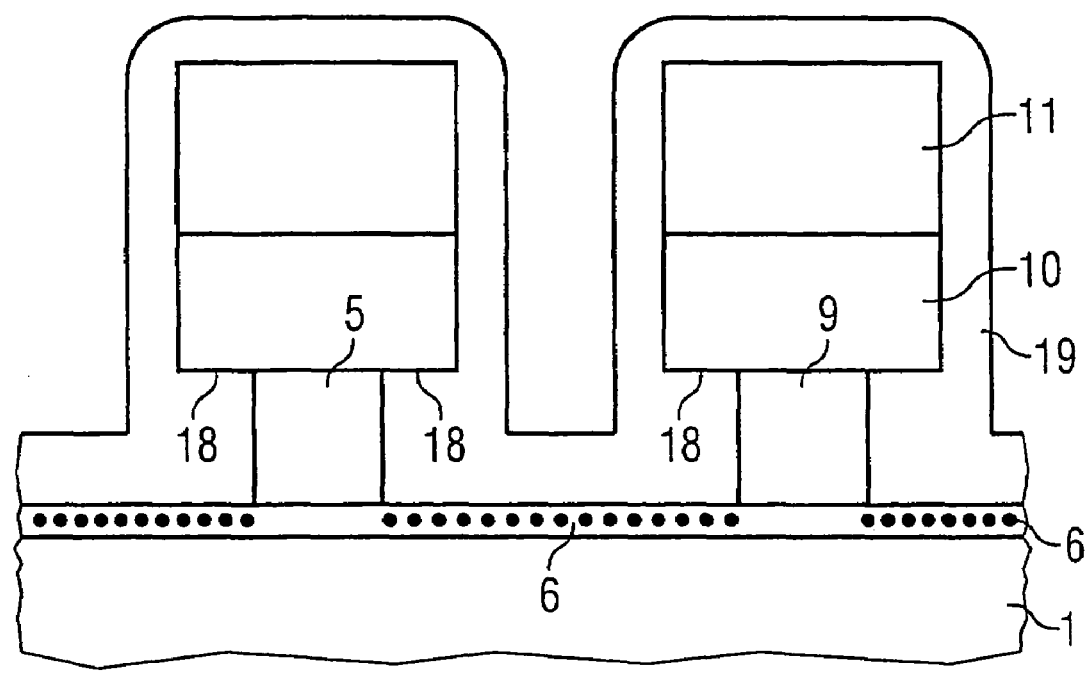
FIG. 11 shows the intermediate product corresponding to FIG. 9 for a further exemplary embodiment.
Figure 12:
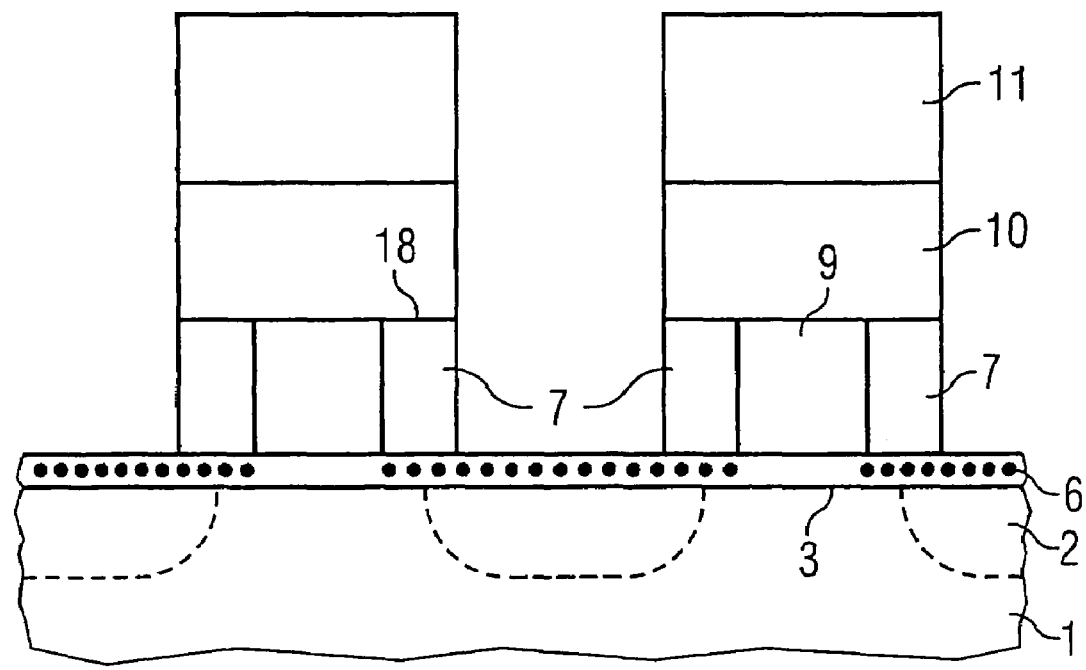
FIG. 12 shows the intermediate product corresponding to FIG. 10 for the exemplary embodiment shown in FIG. 11.

FIG. 11 shows a cross-section through a further exemplary embodiment, in which the first word line layer 9 has been laterally etched back uniformly, so that an overhang 18 is formed by the second word line layer 10 on both sides. In this exemplary embodiment too, electrically conductive spacers 7, which are illustrated in cross-section in FIG. 12, are produced beneath the overhangs 18. The spacers can be produced by first of all depositing a layer of electrically conductive material, preferably a polysilicon layer 19, conformally over the entire surface, as illustrated in FIG. 11, and then etching back this layer to form the spacers 7. A polysilicon layer 19 can be removed highly selectively with respect to the material of the storage layer 6, the base material of which is preferably oxide, by dry etching.

Alternatively, the spacers 7 at the flanks of the first word line layer 9 may be produced by selective epitaxy, in which case the preferred material is polysilicon. The arrangement of the subsequently implanted source/drain regions 2 corresponds to the exemplary embodiment shown in FIG. 10.

Typical voltages for programming, reading and erasing the memory cell are:

Source 3 V, Gate 6 V, Drain 0 V for programming;
Source 0 V, Gate 4 V, Drain 1.5 V for reading;
Source 4 V, Gate −5 V, Drain 0 V for erasing.

The second bit which can be stored is programmed, read and erased accordingly by reversing the polarity of source and drain.

The memory cell and the fabrication method has the following advantages: it is possible to provide memory cells, which are delimited by STI trenches, of a virtual ground array, for which the active areas can easily be patterned by lithography. The result is an extremely narrow space between the word lines, and only a standard thermal gate oxide is required for fabrication without there being any need to apply a complex storage layer pattern. A conventional layer structure crossing the STI trenches is possible for the word lines. The storage regions may be sublithographically locally delimited and self-aligned with respect to the gate electrode. For this purpose, only after the gate electrode or word lines have been patterned are the storage layers produced self-aligned with respect to thereto. The implantation of the nanocrystals or nanodots makes it easy to produce locally fixed, separate storage regions for multi-bit memory cells. Therefore, a surface area of 3 $F^2$ per bit is sufficient with a ground rule of 90 nm. After the storage layers have been produced, the gate electrode is widened in self-aligned manner by the application of electrically conductive spacers. The storage layer ends self-aligned with respect to the gate edge and with respect to the junctions between the source/drain regions and the channel regions. The widening of the gate electrode takes place only for the memory cells of the memory cell array, but not for the transistors of the drive periphery. This makes it easy to optimize both the memory transistors and the drive transistors.

What is claimed is:

1. A memory cell comprising;
    first and second source/drain regions disposed at a top side of a semiconductor body through the introduction of dopant,
    a channel region provided between the first and second source/drain regions;
    a gate dielectric and a gate electrode arranged on the channel region, said gate electrode defining a source-side flank and a drain-side flank and arranged in a word line web comprising at least two word line layers;
    electrically conductive spacers arranged on said source-side flank and said drain-side flank of said gate electrode and electrically connected thereto, said electrically conductive spacers are arranged at the flanks of a first word line layer, further arranged at the bottom of the word line web and having at least one second word line layer projecting over said electrically conductive spacers; and
    a storage layer disposed above the transition or boundary between a channel region and at least one of the source/drain regions, the storage layer being interrupted above an intervening, central part of the channel region and, the storage layer being formed as a portion of the gate dielectric and containing nanocrystals or nanodots.

2. The memory cell as claimed in claim 1, wherein the storage layer is formed as a single layer from a base material of the same type as the gate dielectric, and the material of the nanocrystals or nanodots have been introduced through ion implantation.

3. The memory cell as claimed in claim 1, wherein the material of the nanocrystals or nanodots is selected to form bonding locations for charge carriers.

4. The memory cell as claimed in claim 1, wherein the material of the nanocrystals or nanodots comprises at least one material selected from the group consisting of silicon oxynitride, indium, gallium, tin, arsenic and tungsten.

5. The memory cell as claimed in claim 1, wherein the electrical connection between the electrically conductive spacers and the gate electrode is formed in part by at least one of the source-side and/or the drain-side flank of the gate electrode.

6. The memory cell as claimed in claim 1, wherein the electrically conductive spacers comprise polysilicon.

7. The memory cell as claimed in claim 1, wherein the semiconductor body comprises a semiconductor substrate.

* * * * *